United States Patent [19]
Nozoe et al.

[11] Patent Number: 5,561,312
[45] Date of Patent: Oct. 1, 1996

[54] PROTECTION DEVICE FOR A CMOS INTEGRATED CIRCUIT APPARATUS

[75] Inventors: Minoru Nozoe; Noriaki Hiraga, both of Kyoto, Japan

[73] Assignee: Rohm, Co., Ltd., Kyoto, Japan

[21] Appl. No.: 363,880

[22] Filed: Dec. 27, 1994

[30] Foreign Application Priority Data

Dec. 27, 1993 [JP] Japan ................................. 5-331105

[51] Int. Cl.⁶ ............................. H01L 23/62; H01L 29/76
[52] U.S. Cl. ..................... 257/357; 257/358; 257/360; 257/363; 257/408
[58] Field of Search ........................... 257/336, 344, 257/408, 350, 355, 356, 357, 358, 359, 360, 372, 394, 173, 363, 379, 380; 361/56, 91, 111

[56] References Cited

U.S. PATENT DOCUMENTS 5,270,565  12/1993  Lee et al. .................... 257/360

*Primary Examiner*—Minhloan Tran
*Attorney, Agent, or Firm*—Nikaido, Marmelstein, Murray & Oram LLP

[57] ABSTRACT

A CMOS integrated circuit apparatus has CMOS transistors having an LDD structure. A MOS transistor of a single drain structure for withstanding voltage and a jumper diode for withstanding voltage and latch up prevention are formed in parallel with each other between a power terminal and a ground terminal of the CMOS integrated circuit apparatus.

5 Claims, 4 Drawing Sheets

PROTECTION DEVICE FOR A CMOS INTEGRATED CIRCUIT APPARATUS

BACKGROUND OF THE INVENTION

1. Field of the Invention

The present invention relates to a metal oxide semiconductor (MOS) integrated circuit apparatus, and more particularly, relates to the protection of a MOS device.

2. Description of the Prior Art

To improve the integration of a metal oxide semiconductor (MOS) integrated circuit, it is inevitable that the structure of a MOS transistor is minute. On the contrary, if the structure of the MOS transistor is minute, the channel length decreases, so that a hot electron effect remarkably decrease the reliability of the MOS transistor. For this reason, in recent years, a lightly doped drain (LDD) structure has been used instead of the conventional single drain structure.

With the LDD structure, compared to the single drain structure which is of high density, the extent of the depletion layer is large, the electric field is weak, and the substrate current and the gate current decrease, so that the reliability increases.

In the LDD structure where the oxide film of the gate is thin, however, the electrostatic breakage readily occurs. Thus, in the CMOS integrated circuit apparatus, the electrostatic breakage withstanding voltage of the input and output terminals decreases as the structure of the device becomes minute. For this reason, a protecting device is provided at the signal input and output terminals so that no high voltage is directly applied to the protecting device and to the gate oxide film of the CMOS device provided inside.

The number of devices connected to the power terminal acceleratingly increases as the integration advances, so that the withstanding voltage of the power terminal against static electricity is decreased by errors caused in checking the circuits in designing and in checking the pattern layout. In the CMOS integrated circuit, a parasitic transistor is inevitably generated. Since the parasitic transistor constitutes a thyristor, once it is activated, the activated condition is maintained, so that the operation of the CMOS device is damaged. The condition where the activated condition of the parasitic transistor is maintained is called a latch up.

SUMMARY OF THE INVENTION

An object of the present invention is to provide a MOS integrated circuit apparatus where the withstanding voltage of the power terminal against static electricity is increased and latch up does not readily occur.

A MOS integrated circuit apparatus of the present invention is provided with the following: a metal oxide semiconductor device of lightly doped drain structure; a power terminal; a ground terminal; a metal oxide semiconductor transistor of single drain structure connected between the power terminal and the ground terminal; and a jumper diode having a resistor component connected between the power terminal and the metal oxide semiconductor device, a P-N junction which forms the jumper diode being connected between the power terminal and the ground terminal.

According to such features, since the primary breakdown voltage of the MOS transistor of single drain structure is low compare to a MOS transistor having an LDD structure, the MOS transistor of a single drain structure causes a primary breakdown against an electrostatic pulse or an over voltage surge applied to the power terminal, so that a high voltage is prevented from being applied to the circuits formed inside. Since the secondary breakdown voltage of the MOS transistor of the single drain structure is high, it is unlikely that the MOS transistor of the single drain structure breaks due to a secondary breakdown. When an electrostatic pulse or an over voltage surge is applied in a normal direction, the jumper diode is activated and serves as a withstanding device. The jumper diode is disabled when a high voltage is applied in the opposite direction. The jumper diode serves as a latch up preventer since its resistor limits the current which can cause the latch up by flowing from the input terminal to the CMOS device formed inside.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
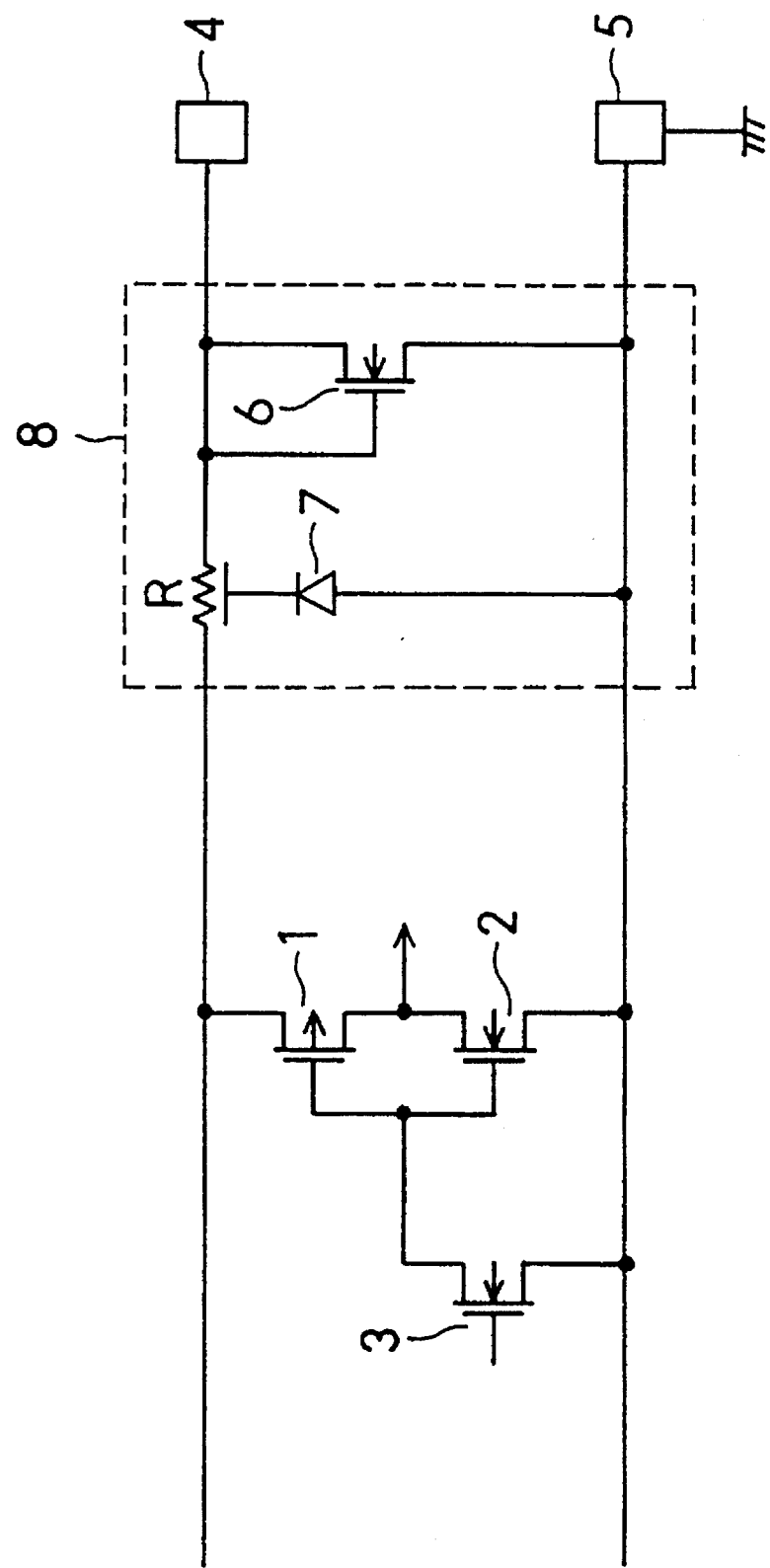
FIG. 1 is a circuit diagram of a relevant portion of a CMOS integrated circuit apparatus embodying the present invention.

Hereinafter, an embodiment of the present invention will be described with reference to the drawings. Referring to FIG. 1, there is shown a relevant portion of a CMOS integrated circuit apparatus according to this embodiment. Reference numerals 1 and 2 represent a P-channel MOS transistor and an N-channel MOS transistor which constitute a CMOS. Reference numeral 3 is a MOS transistor for supplying a signal to the gates of the transistors 1 and 2.

Reference numeral 4 represents a power terminal. Reference numeral 5 is a ground terminal. Reference numeral 8 is a protecting circuit which includes an N-channel MOS transistor 6 connected between the power terminal 4 and the ground terminal 5, and a jumper diode 7. The jumper diode 7 has a resistor R of several ohms on the cathode side.

Figure 2:
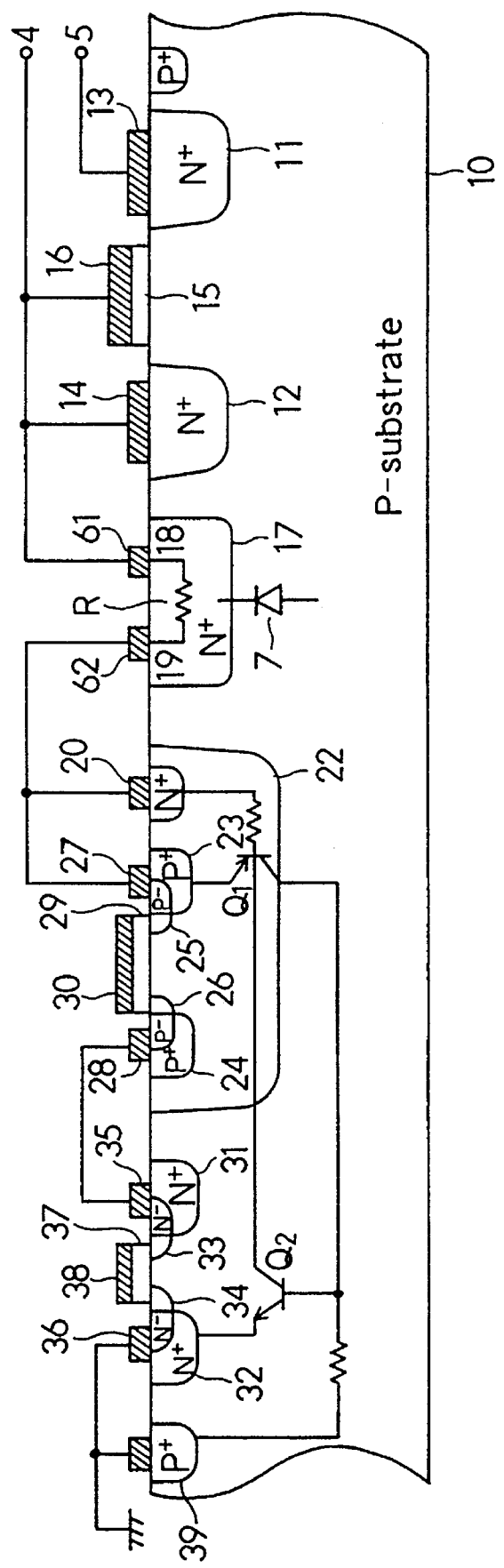
FIG. 2 shows the structure of the circuit of FIG. 1.

Referring to FIG. 2, there are shown the structures of the devices corresponding to the circuit of FIG. 1. However, the transistor 3 is not shown. In FIG. 2, reference numeral 10 represents a P-type semiconductor substrate. Reference numerals 11 and 12 represent a source region and a drain region of the transistor 6 constituted by an $N^+$ layer. Reference numerals 13 and 14 represents a source electrode and a drain electrode. Reference numeral 15 represents a gate oxide film. Reference numeral 16 represents a gate electrode. As is apparent from this structure, the MOS transistor 6 is of single drain structure.

Reference numeral 17 represents an $N^+$ diffusion layer. The diode 7 of P-N junction is formed between the substrate 10 and the $N^+$ diffusion layer 17. A right contact 61 on an $N^+$ diffusion layer 18 is connected to the power terminal 4, and a left contact 62 on an $N^+$ diffusion layer 19 is connected to a succeeding CMOS device. Between the right and left contacts 61 and 62, a resistor component R constituted by the $N^+$ diffusion layer is generated. Reference designation R in FIG. 1 represents a resistor constituted by the $N^+$ layer.

At least one of the transistors 1 and 2 constituting the CMOS has an LDD structure. Reference numeral 22 represents an N well. In the N well, a source region 23 and a drain region 24 each constituting a P layer are formed. Reference numerals 25 and 26 represent P⁻ layers of low density. Reference numerals 27 and 28 represent a source electrode and a drain electrode. Reference numeral 29 represents a gate oxide film. Reference numeral 30 represents a gate electrode. These elements 22 to 30 constitute a P-channel MOS transistor 1 having an LDD structure.

Elements 31 to 38 constitute an N-channel MOS transistor 2 of LDD structure. Reference numerals 31 and 32 represent a drain region and a source region each constituted by an N⁺ layer. Reference numerals 33 and 34 represent N⁻ diffusion layers of low density. Reference numeral 35 represents a drain electrode. Reference numeral 36 represents a source electrode. Reference numeral 37 represents a gate oxide film. Reference numeral 38 represents a gate electrode. Reference numeral 39 represents a P⁺ region for connection to ground.

The transistors 1 and 2 and the substrate 10 constitute a parasitic PNP transistor Q1 and a parasitic NPN transistor Q2. When a current, input through the source electrode of the transistor 1, flows into the emitter of the PNP transistor Q1 to activate the PNP transistor Q1, the NPN transistor Q2 is also activated. Since the transistors Q1 and Q2 constitute a thyristor, once they are activated, latch up occurs. In this embodiment, however, since the current flowing from the power terminal 4 toward the transistor 1 is limited by the resistor R of the portion constituting the jumper diode 7, latch up does not readily occur even if a voltage surge is applied to the power terminal 4.

Figure 3:
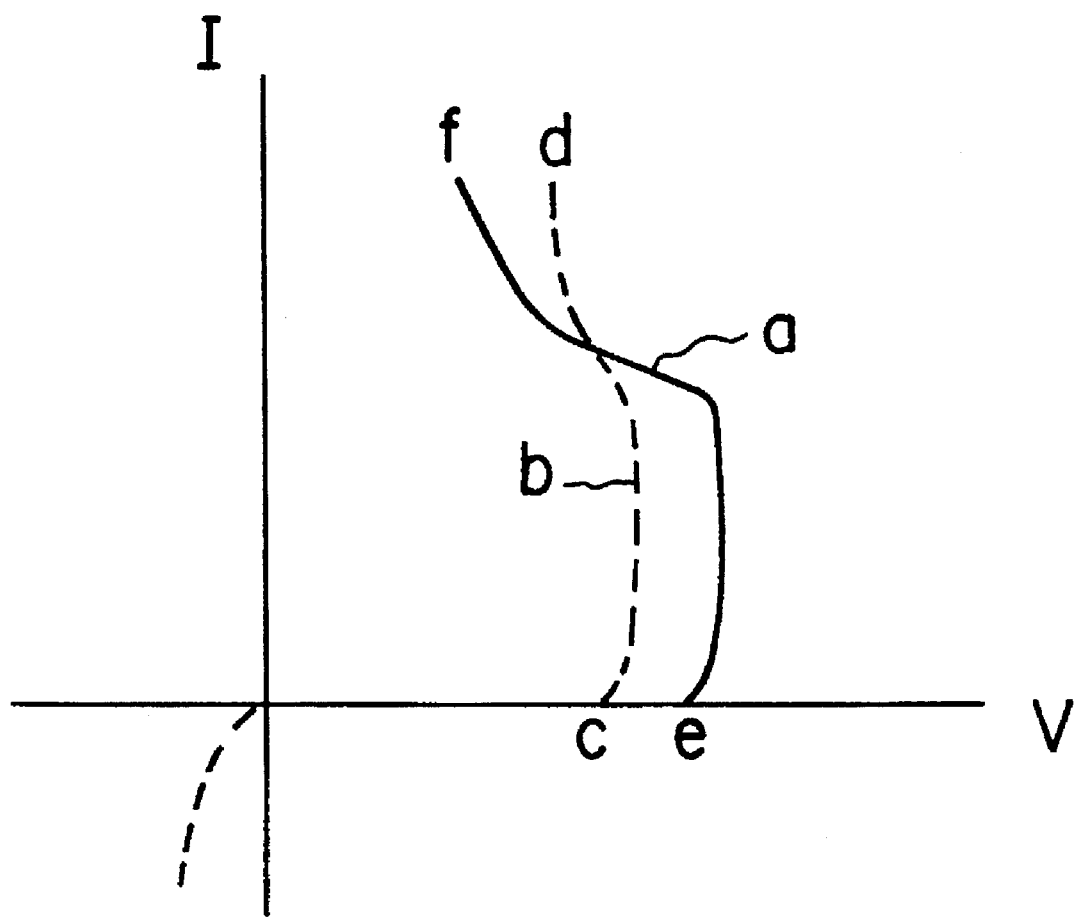
FIG. 3 shows the voltage to current characteristics of a MOS transistor of LDD structure and a CMOS transistor of single drain structure.

Referring to FIG. 3, $\underline{a}$ represents the voltage to current characteristics of the MOS transistors 1 and 2 of LDD structure, and $\underline{b}$ represents the voltage to current characteristic of the MOS transistor 6 of single drain structure. As is apparent from the characteristics, the primary breakdown voltage $\underline{c}$ of the transistor 6 of single drain structure is low and the secondary breakdown voltage $\underline{d}$ thereof is high compared to the primary breakdown voltage $\underline{e}$ and secondary breakdown voltage $\underline{f}$ of the transistors 1 and 2 having an LDD structure. For this reason, when a positive electrostatic pulse or over voltage surge is applied to the power terminal 4, the transistor 6 is activated to prevent the breakage of the transistors 1 and 2 formed inside. It is unlikely that the transistor 6 breaks since the secondary breakage voltage of the transistor 6 is high. When a negative electrostatic pulse or over voltage surge is applied to the power terminal 4, the transistor 6 is disabled. However, the parasitic transistor of the transistor 6 and the diode 7 are activated to protect the transistors 1 and 2 formed inside.

While a P-type substrate is used in the above-described embodiment, an N-type substrate may be used. Moreover, while the transistor 6 is of N-channel type, it may be of P-channel type. In that case, the gate of the transistor 6 is connected not to the power terminal 4 but to the ground terminal 5.

Figure 4:
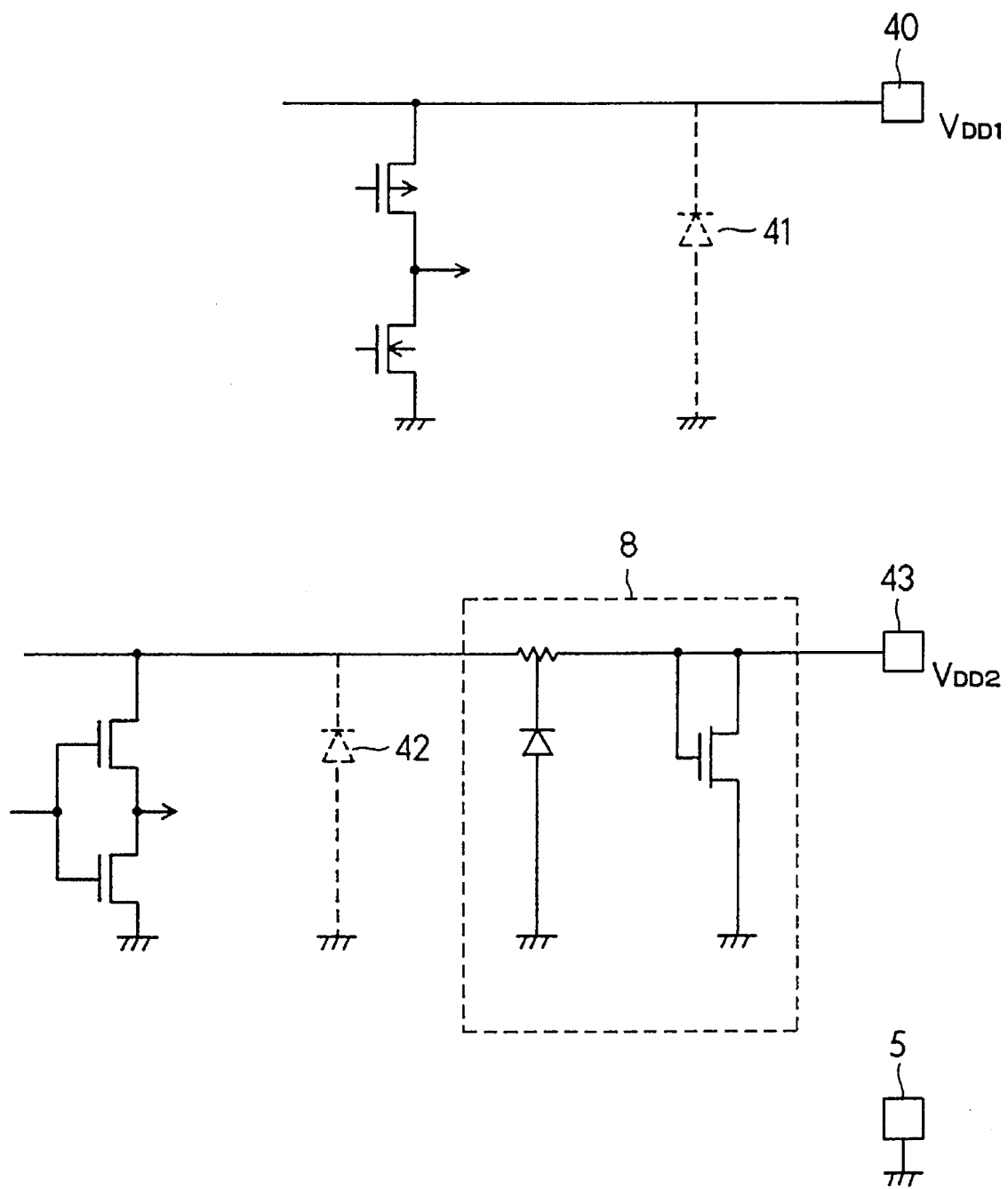
FIG. 4 is a circuit diagram of a relevant portion of another embodiment of the present invention.

Referring to FIG. 4, there is shown an example of the application of the above-described protecting circuit 8. Sometimes, a plurality of power terminals are provided in one integrated circuit apparatus. At this time, with respect to a power terminal 40, when a parasitic diode 41 formed inside is sufficiently large and serves as the protecting circuit, no protecting circuit is provided for the power terminal 40. On the contrary, the protecting circuit 8 is provided for a power terminal 43 when a parasitic diode 42 formed inside is small.

As described above, according to the present invention, even in an integrated circuit of extremely minute structure having a MOS of LDD structure, a malfunction and a breakage due to an external surface voltage or electrostatic pulse input through the power terminal are sufficiently prevented, and latch up of the parasitic transistor is sufficiently prevented.

Obviously, many modifications and variations of the present invention are possible in light of the above teachings. It is therefore to be understood that within the scope of the appended claims, the invention may be practiced other than as specifically described.

What is claimed is:

1. A metal oxide semiconductor integrated circuit apparatus comprising:

a CMOS transistor device including a P-channel MOS transistor of lightly doped drain and source structure and an N-channel MOS transistor of lightly doped drain and source structure;

a power terminal;

a ground terminal connected to a source electrode of said N-channel MOS transistor;

a metal oxide semiconductor transistor of single drain structure connected between said power terminal and said ground terminal; and a jumper diode having a resistor component connected between said power terminal and a source electrode of said P-channel MOS transistor, a P-N junction which forms said jumper diode being connected between said power terminal and said ground terminal.

2. A metal oxide semiconductor integrated circuit apparatus according to claim 1, wherein said jumper diode comprises a semiconductor region formed within a surface of a semiconductor substrate for forming said P-N junction and two contacts provided in the semiconductor region, said semiconductor region being of a conductivity type opposite to that of the semiconductor substrate, and wherein one of the two contacts is connected to said power terminal and the other of the two contacts is connected to said source electrode of said P-channel MOS transistor.

3. A metal oxide semiconductor integrated circuit apparatus according to claim 2, wherein the resistor component of said jumper diode constituted by said semiconductor region is generated between said two contacts within said semiconductor region.

4. A metal oxide semiconductor integrated circuit apparatus according to claim 1, wherein the metal oxide semiconductor transistor of single drain structure has a primary breakdown voltage lower than those of said P-channel MOS transistor and said N-channel MOS transistor and has a secondary breakdown voltage higher than those of said P-channel MOS transistor and said N-channel MOS transistor.

5. A metal oxide semiconductor integrated circuit apparatus according to claim 1, wherein when an abnormal voltage is applied to said power terminal, the resistor component of said jumper diode limits a current flowing to the CMOS transistor device to prevent a latch up of a parasitic transistor of the CMOS transistor device.

* * * * *